(12) United States Patent
Bobba et al.

(10) Patent No.: US 6,658,629 B1
(45) Date of Patent: Dec. 2, 2003

(54) TECHNIQUE FOR OPTIMIZING DECOUPLING CAPACITANCE SUBJECT TO LEAKAGE POWER CONSTRAINTS

(75) Inventors: Sudhakar Bobba, Sunnyvale, CA (US); Pradeep Trivedi, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1 day.

(21) Appl. No.: 10/142,187

(22) Filed: May 9, 2002

(51) Int. Cl.[7] ............................................. G06F 17/50
(52) U.S. Cl. .................................. 716/2; 716/11; 716/10
(58) Field of Search .............................. 716/2, 1, 5, 11, 716/8, 10, 9, 758, 294, 215, 100; 327/536, 390, 306, 541; 438/240, 242, 239, 261; 257/758, 299, 215, 100

(56) References Cited

U.S. PATENT DOCUMENTS

| 5,610,833 | A | * | 3/1997 | Chang et al. .................. 716/11 |
| 5,689,208 | A | * | 11/1997 | Nadd .......................... 327/390 |
| 5,994,949 | A | * | 11/1999 | Menichelli .................... 327/536 |
| 6,046,625 | A | * | 4/2000 | Menichelli .................... 327/536 |
| 6,335,238 | B1 | * | 1/2002 | Hanttangady et al. ...... 438/240 |

* cited by examiner

Primary Examiner—Vuthe Siek
Assistant Examiner—Binh Tat
(74) Attorney, Agent, or Firm—Rosenthal & Osha L.L.P.

(57) ABSTRACT

A technique for optimizing decoupling capacitance on an integrated circuit while meeting leakage power constraints of the integrated circuit is provided. The technique involves the formulation of a linear optimization problem using physical characteristics and constraints of the integrated circuit, where a linear solution to the linear optimization problem yields an optimal decoupling capacitance presence on the integrated circuit.

16 Claims, 4 Drawing Sheets

TECHNIQUE FOR OPTIMIZING DECOUPLING CAPACITANCE SUBJECT TO LEAKAGE POWER CONSTRAINTS

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (12). The microprocessor (10) has, among other components, a central processing unit (also known and referred to as "CPU" or "execution unit") (14) and a memory controller (also known as "load/store unit") (16). The CPU (14) is where the actual arithmetic and logical operations of the computer system take place. To facilitate the execution of operations by the CPU (14), the memory controller (16) provides the CPU (14) with necessary instructions and data from the memory (12). The memory controller (16) also stores information generated by the CPU (14) into the memory (12).

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supply to a particular computer system element varies, which, in turn, effects the integrity of the element's output. Typically, this power variation results from the distance between a power supply for the element and the element itself. This distance may lead to the element not receiving power (via current) at the exact time it is required.

As shown in FIG. 2, one approach used by designers to combat this performance-inhibiting behavior is introducing decoupling capacitance to a particular circuit by positioning one or more decoupling capacitors (13) close to elements (15) in an integrated circuit (17). These decoupling capacitors (13) store charge from the power supply and distribute the charge to the elements (15) when needed. For example, if power received by a element from a power supply line (19) attenuates, one or more decoupling capacitors (13) will distribute charge to the element (15) to ensure that the element (15) is not affected by the power variation on the power supply line (19). In essence, a decoupling capacitor acts as a local power supply for one or more specific elements in a computer system.

However, important considerations must be made as to the assignment of one or more decoupling capacitors to particular capacitance needing elements because capacitors have particular undesirable characteristics. One such characteristic pertains to two types of capacitors: thin-oxide capacitors and thick-oxide capacitors. A thin-oxide capacitor is designed using one or more transistors that have thin gate dielectric thicknesses, and although thin-oxide capacitors provide a relatively large amount of decoupling capacitance, they are prone to undesirable gate-tunneling leakage currents. Such leakage current, in turn, increases the leakage power of a circuit, resulting in increased power and heat dissipation by the circuit. Alternatively, a thick-oxide capacitor is designed using one or more transistors that have thick gate dielectric thicknesses, and although thick-oxide capacitors have less leakage currents, they provide a smaller amount of decoupling capacitance than thin-oxide capacitors. Thus, there is a need for a technique that optimizes decoupling capacitance such that decoupling capacitance on an integrated circuit is increased while leakage power constraints are met.

SUMMARY OF INVENTION

According to one aspect of the present invention, a method for assigning thin-oxide and thick-oxide capacitors on an integrated circuit, where the integrated circuit has a capacitance requirement and a leakage power constraint, comprises: formulating a linear optimization problem, where formulating the linear optimization problem comprises defining a first value as a value of capacitance that is obtained by replacing the thick-oxide capacitors with the thin-oxide capacitors subject to the leakage power constraint; solving the linear optimization problem to determine a maximum value for the first value; and determining an optimal percentage of thin-oxide capacitance using the maximum value.

According to another aspect, a computer system comprises a processor, a memory, and instructions, residing in the memory and executable by the processor, for: formulating a linear optimization problem, where formulating the linear optimization problem comprises defining a first value as a value of capacitance that is obtained by replacing the thick-oxide capacitors with the thin-oxide capacitors subject to the leakage power constraint; solving the linear optimization problem to determine a maximum value for the first value; and determining an optimal percentage of thin-oxide capacitance using the maximum value.

According to another aspect, a computer-readable medium having recorded therein instructions executable by processing comprises instructions for: formulating a linear optimization problem, where formulating the linear optimization problem comprises defining a first value as a value of capacitance that is obtained by replacing the thick-oxide capacitors with the thin-oxide capacitors subject to the leakage power constraint; and determining an optimal percentage of thin-oxide capacitance dependent on a maximization of the first value.

According to another aspect, a method for assigning thin-oxide and thick-oxide capacitors on an integrated circuit, where the integrated circuit has a capacitance requirement and a leakage power constraint, comprises: a step for formulating a linear optimization problem, where the step for formulating the linear optimization problem comprises defining a first value as a value of capacitance that is obtained by replacing the thick-oxide capacitors with the thin-oxide capacitors subject to the leakage power constraint; a step for solving the linear optimization problem to determine a maximum value for the first value; and a step for determining an optimal percentage of thin-oxide capacitance using the maximum value.

Other aspects and advantages of the invention will be apparent from the following description and the appended claims.

DETAILED DESCRIPTION

Embodiments of the present invention relate to a technique for optimizing decoupling capacitance on an integrated circuit while meeting leakage power constraints, Embodiments of the present invention further relate to a technique for formulating a linear optimization problem for optimizing decoupling capacitance on an integrated circuit, where the linear optimization problem is solvable using a linear solver program.

Figure 1:
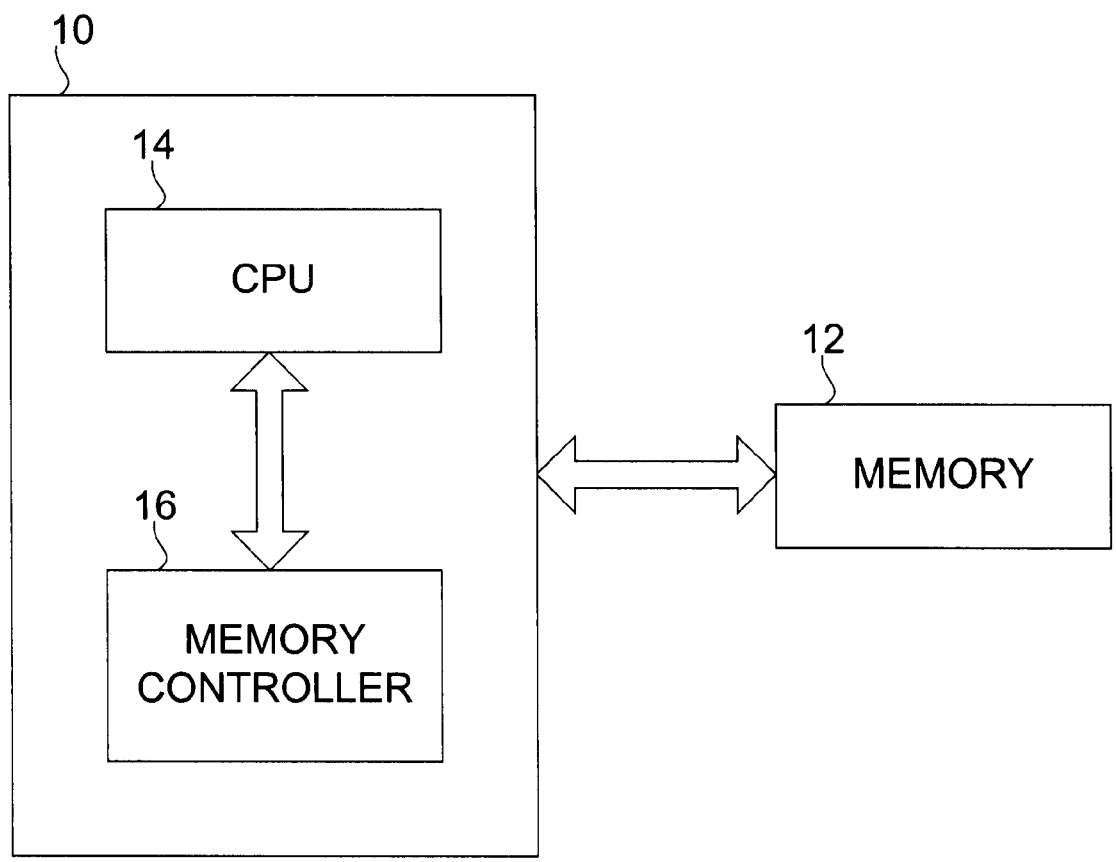
FIG. 1 shows a typical computer system.
Figure 2:
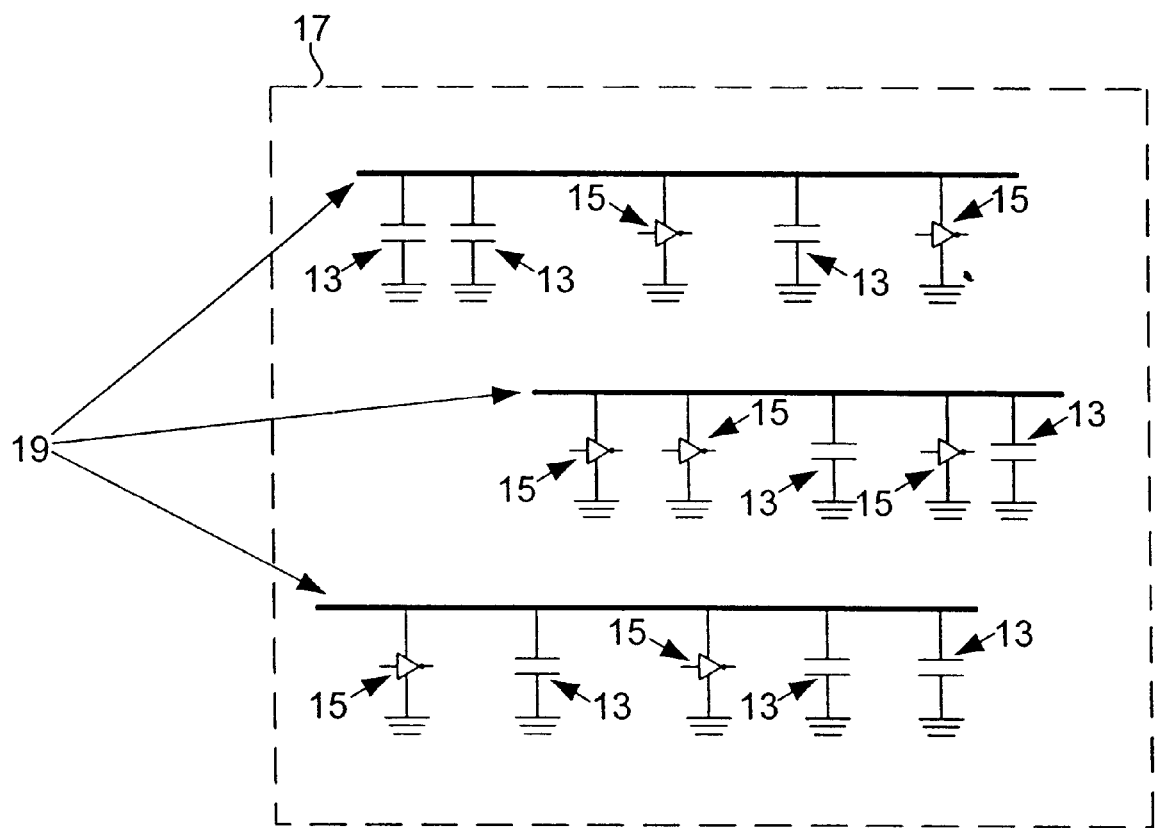
FIG. 2 shows a typical arrangement of decoupling capacitors and circuit elements.
Figure 3A:
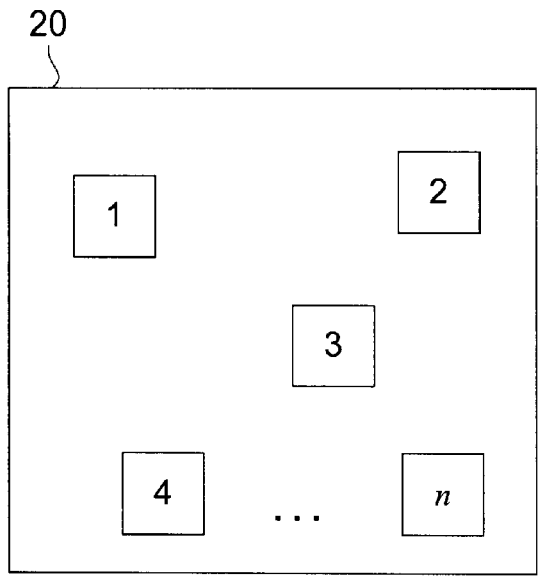
FIG. 3a shows an integrated circuit that is referenced by the discussion of FIG. 3b.

FIG. 3a shows an integrated circuit (20) that will be used as a reference for the discussion of the present invention. The integrated circuit (20) is made up of several regions 1 ... n, where n represents the number of regions being considered. It is desired to optimize the amount of capacitance in each of these regions while meeting leakage power budgets of either the entire integrated circuit or each of the regions shown in FIG. 3a.

Determining an optimal decoupling capacitance arrangement involves determining a maximum value of the following term (1) subject to the constraint equation (2):

$$\sum_{k=1}^{n} a_k x_k, \quad (1)$$

where $a_k$ represents the extra capacitance obtained by replacing thick-oxide capacitors with thin-oxide capacitors in the kth region, and where $x_k$ represents the percentage of thin-oxide decoupling capacitance in the kth region.

Those skilled in the art will understand that because x represents a percentage, the value of x is between 0 and 1, inclusive. Those skilled in the art will also understand that $a_k$ is normalized to the area of the kth region. Further, those skilled in the art will appreciate that x can be a discrete value between 0 and 1, inclusive.

As stated above, the determination of the maximum value for term (1) is subject to the following constraint equation (2):

$$\sum_{k=1}^{n} w_k x_k \le C, \quad (2)$$

where $w_k$ represents the extra leakage current resulting from the replacement of thick-oxide capacitors by thin-oxide capacitors in the kth region, and where C represents the leakage power budget for the integrated circuit (20).

In alternative embodiments, a leakage power constraint may be particular to a region instead of the entire integrated circuit (20), in which case the constraint equation for that particular region is:

$$w_i x_i \le C_i, \quad (3)$$

where $w_i$ represents the extra leakage current resulting from the replacement of thick-oxide capacitors by thin-oxide capacitors in that particular ith region, where $x_i$ represents the percentage of thin-oxide capacitors in the ith region, and where $C_i$ represents the leakage power budget for the ith region.

Equations/terms (1), (2), and (3) above form a linear optimization problem with linear constraints, and therefore, by solving for the maximum value of term (1) subject to equation (2) and/or possibly equation (3), a value for x may be determined, where x represents what percentage of thin-oxide capacitance that can be used in particular regions of the integrated circuit or in the integrated circuit as a whole. More particularly, the solved value of x represents an optimal amount of thin-oxide capacitance that can be used without violating leakage power constraints.

Those skilled in the art will appreciate that the linear optimization algorithm developed above may be solved using any number of linear problem solving techniques. For example, one or ordinary skill in the art will understand the aforementioned linear optimization problem may be solved using LaGrange multipliers. In another example, linear programming software may be used to determine an optimal amount of thin-oxide capacitance given the formulation technique above.

Figure 3B:
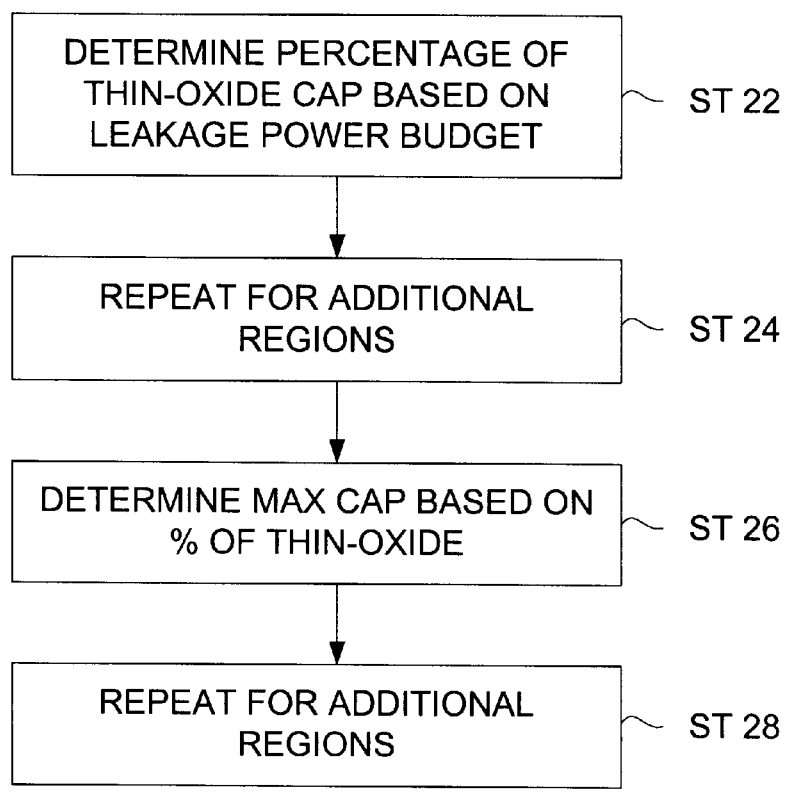
FIG. 3b shows a flow process in accordance with an embodiment of the present invention.

FIG. 3b shows a flow process describing a technique for optimizing decoupling capacitance on the integrated circuit (20) in accordance with an embodiment of the present invention. Initially, a determination is made as to the percentage of thin-oxide capacitance based on the extra leakage current resulting in a region when the thick-oxide capacitance is replaced by the thin-oxide capacitance in the region (step 22). This may be repeated for a desired number of regions (step 24). Thereafter, a determination is made as to the optimal value of capacitance based on the percentage of thin-oxide capacitance determined above and the capacitance resulting from the replacement of the thick-oxide with the thin-oxide capacitance (step 26). This determination of the optimal value may be made based on a plurality of regions on the integrated circuit (20) (step 28).

Figure 4:
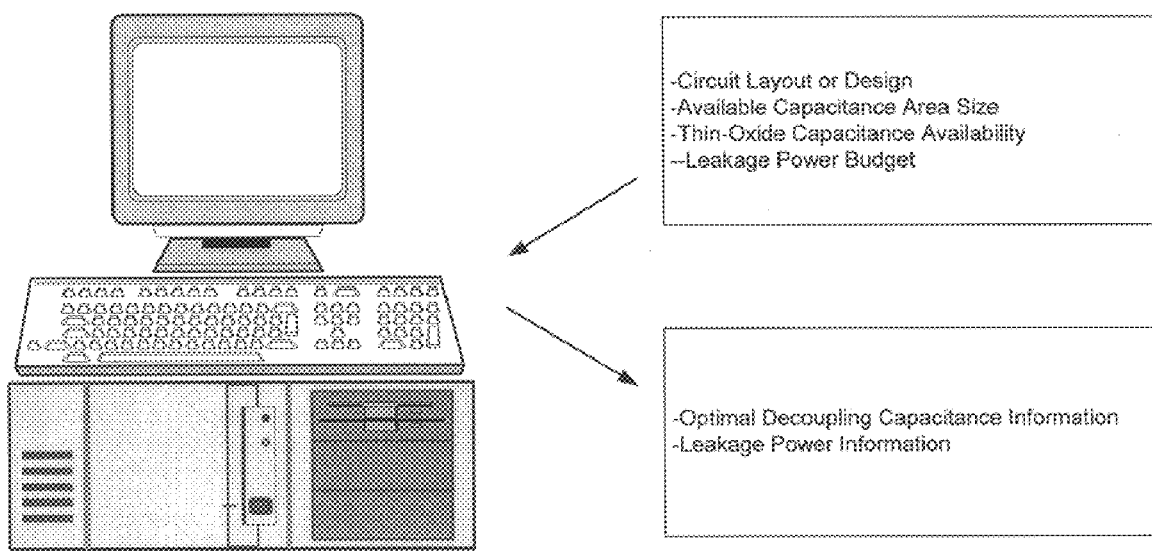
FIG. 4 shows a computer system in accordance with an embodiment of the present invention.

FIG. 4 shows an exemplary computer system (30) that determines an optimal decoupling capacitance in accordance with an embodiment of the present invention. Input parameters (32) may include a circuit design or layout, an available capacitance area size for a particular area being considered, an amount of thin-oxide capacitors available for the area being considered, and leakage power budget information for the integrated circuit or particular regions thereon. One of ordinary skill in the art will understand that the input parameters (32) may include additional values, such as information relating to per unit areas of thin-oxide and thick-oxide capacitances present on the integrated circuit or particular regions thereon.

The input parameters (32) serve as input data to the computer system (30) via some computer-readable medium, e.g., network path, floppy disk, input file, etc. The computer system (30) then stores the input parameters (32) in memory (not shown) to subsequently determine (via microprocessor functions) an optimal decoupling capacitance using one of the linear problem formulation techniques discussed in the present invention. Thereafter, the computer system (30) outputs the optimal decoupling capacitance information (34) via some user-readable medium, e.g., monitor display, network path, etc., where the optimal decoupling capacitance includes at least a percentage of the available capacitance area that can be used for thin-oxide capacitance instead of thick-oxide capacitance. The computer system (30) may additionally output the amount of leakage current resulting from the optimal decoupling capacitance determination.

Those skilled in the art will appreciate that in other embodiments, a software program capable of generating optimal decoupling capacitance information consistent with the linear optimization formulation techniques presented in the present invention may be used. The software program may also be capable of determining leakage current and power values corresponding to the generated optimal decoupling capacitance information.

Advantages of the present invention may include one or more of the following. In some embodiments, because decoupling capacitance on an integrated circuit may be optimized using a linear optimization formulation technique in accordance with the present invention, integrated circuit performance may be improved.

In some embodiments, because a linear optimization formulation technique in accordance with the present invention may be used to determine an optimal assignment of thin-oxide and thick-oxide capacitance, valuable time that would otherwise be used to determine an optimal capacitance is saved.

In some embodiments, because a linear optimization formulation technique in accordance with the present invention may be used to determine an optimal capacitance for an integrated circuit or regions thereon subject to leakage power constraints of the integrated circuit or regions thereon, capacitance may be maximized while meeting a leakage power budget of the integrated circuit or regions thereon.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for assigning thin-oxide and thick-oxide capacitors on an integrated circuit, the integrated circuit having a capacitance requirement and a leakage power constraint, the method comprising:

formulating a linear optimization problem, wherein formulating the linear optimization problem comprises:

defining a first value as a value of capacitance that is obtained by replacing the thick-oxide capacitors with the thin-oxide capacitors subject to the leakage power constraint;

solving the linear optimization problem to determine a maximum value for the first value; and determining an optimal percentage of thin-oxide capacitance using the maximum value.

2. The method of claim 1, wherein the leakage power constraint is for a particular region on the integrated circuit, and wherein the optimal percentage of thin-oxide capacitance is determined for the particular region.

3. The method of claim 1, wherein the determination of the maximum value of capacitance that is obtained by replacing the thick-oxide capacitors with the thin-oxide capacitors is dependent on an area of the integrated circuit.

4. The method of claim 1, wherein the maximum value of capacitance that is obtained by replacing the thick-oxide capacitors with the thin-oxide capacitors is determined over a plurality of regions on the integrated circuit.

5. The method of claim 4, wherein the determination of the maximum value of capacitance that is obtained by replacing the thick-oxide capacitors with the thin-oxide capacitors is dependent on areas of the plurality of regions.

6. A computer system, comprising:

a processor;

a memory; and instructions, residing in the memory and executable by the processor, for:

formulating a linear optimization problem, wherein formulating the linear optimization problem comprises:

defining a first value as a value of capacitance that is obtained by replacing the thick-oxide capacitors with the thin-oxide capacitors subject to a leakage power constraint;

solving the linear optimization problem to determine a maximum value for the first value; and determining an optimal percentage of thin-oxide capacitance using the maximum value.

7. The computer system of claim 6, wherein the leakage power constraint is for a particular region on the integrated circuit, and wherein the optimal percentage of thin-oxide capacitance is determined for the particular region.

8. The computer system of claim 6, wherein the determination of the maximum value of capacitance that is obtained by replacing the thick-oxide capacitors with the thin-oxide capacitors is dependent on an area of the integrated circuit.

9. The computer system of claim 6, wherein the maximum value of capacitance that is obtained by replacing the thick-oxide capacitors with the thin-oxide capacitors is determined over a plurality of regions on the integrated circuit.

10. The computer system of claim 9, wherein the determination of the maximum value of capacitance that is obtained by replacing the thick-oxide capacitors with the thin-oxide capacitors is dependent on areas of the plurality of regions.

11. A computer-readable medium having recorded therein instructions executable by processing, the instructions for:

formulating a linear optimization problem, wherein formulating the linear optimization problem comprises:

defining a first value as a value of capacitance that is obtained by replacing the thick-oxide capacitors with the thin-oxide capacitors subject to a leakage power constraint; and determining an optimal percentage of thin-oxide capacitance dependent on a maximization of the first value.

12. The computer-readable medium of claim 11, wherein the leakage power constraint is for a particular region on the integrated circuit, and wherein the optimal percentage of thin-oxide capacitance is determined for the particular region.

13. The computer-readable medium of claim 11, wherein the determination of the maximum value of capacitance that is obtained by replacing the thick-oxide capacitors with the thin-oxide capacitors is dependent on an area of the integrated circuit.

14. The computer-readable medium of claim 11, wherein the maximum value of capacitance that is obtained by replacing the thick-oxide capacitors with the thin-oxide capacitors is determined over a plurality of regions on the integrated circuit.

15. The computer-readable medium of claim 4, wherein the determination of the maximum value of capacitance that is obtained by replacing the thick-oxide capacitors with the thin-oxide capacitors is dependent on areas of the plurality of regions.

16. A method for assigning thin-oxide and thick-oxide capacitors on an integrated circuit, the integrated circuit having a capacitance requirement and a leakage power constraint, the method comprising:

step for formulating a linear optimization problem, wherein the step for formulating the linear optimization problem comprises:

defining a first value as a value of capacitance that is obtained by replacing the thick-oxide capacitors with the thin-oxide capacitors subject to the leakage power constraint;

step for solving the linear optimization problem to determine a maximum value for the first value; and step for determining an optimal percentage of thin-oxide capacitance using the maximum value.

* * * * *

UNITED STATES PATENT AND TRADEMARK OFFICE
CERTIFICATE OF CORRECTION

PATENT NO. : 6,658,629 B1
DATED : December 2, 2003
INVENTOR(S) : Sudhakar Bobba et al.

It is certified that error appears in the above-identified patent and that said Letters Patent is hereby corrected as shown below:

Column 6,
Line 63, please replace "4" with -- 11 --.

Signed and Sealed this

Twenty-third Day of March, 2004

JON W. DUDAS
*Acting Director of the United States Patent and Trademark Office*